(12) United States Patent
Ishii et al.

(10) Patent No.: US 10,199,591 B2
(45) Date of Patent: Feb. 5, 2019

(54) DISPLAY DEVICE

(71) Applicant: Japan Display Inc., Tokyo (JP)

(72) Inventors: Yoshinori Ishii, Tokyo (JP); Kazufumi Watabe, Tokyo (JP); Isao Suzumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/477,195

(22) Filed: Apr. 3, 2017

(65) Prior Publication Data
US 2017/0338433 A1 Nov. 23, 2017

(30) Foreign Application Priority Data

May 19, 2016 (JP) ................... 2016-100485

(51) Int. Cl.
| | | |
|---|---|---|
| *H01L 51/50* | (2006.01) | |
| *H01L 29/49* | (2006.01) | |
| *H01L 27/32* | (2006.01) | |
| *G02F 1/1333* | (2006.01) | |
| *G02F 1/136* | (2006.01) | |
| *G02F 1/1362* | (2006.01) | |
| *G02F 1/153* | (2006.01) | |
| *H01L 51/00* | (2006.01) | |
| *H01L 51/05* | (2006.01) | |

(Continued)

(52) U.S. Cl.
CPC .......... *H01L 51/5012* (2013.01); *G02F 1/136* (2013.01); *G02F 1/133305* (2013.01); *G02F 1/133345* (2013.01); *G02F 1/136277* (2013.01); *G02F 1/1533* (2013.01); *H01L 51/0097* (2013.01); *H01L 51/0508* (2013.01); *H01L 51/107* (2013.01); *H01L 51/5237* (2013.01); *H01L 51/5253* (2013.01); *G02F 2001/136295* (2013.01); *G02F 2001/1536* (2013.01); *H01L 27/3262* (2013.01); *H01L 29/4908* (2013.01)

(58) Field of Classification Search
CPC ............. H01L 51/5012; H01L 51/0097; H01L 51/0508; H01L 51/107; H01L 51/5237; H01L 51/5253; G02F 1/133345; G02F 1/133305; G02F 1/136; G02F 1/136277; G02F 2001/1536; G02F 2001/136295
See application file for complete search history.

(56) References Cited

U.S. PATENT DOCUMENTS

2006/0192485 A1* 8/2006 Song .................... H01L 27/322
313/506
2012/0276694 A1* 11/2012 Koezuka ............. H01L 29/7869
438/151

(Continued)

FOREIGN PATENT DOCUMENTS

JP 2004-317649 A 11/2004

OTHER PUBLICATIONS

Dictionary: https://en.oxforddictionaries.com/definition/laminate.*

(Continued)

*Primary Examiner* — Su C Kim
(74) *Attorney, Agent, or Firm* — Typha IP LLC

(57) ABSTRACT

An organic EL display device has a TFT formed on the substrate, and an organic EL layer formed on the TFT. A protective layer is formed on the organic EL layer, and a first barrier layer which contains AlOx is formed between the substrate and the TFT.

10 Claims, 9 Drawing Sheets

(51) Int. Cl.
*H01L 51/10* (2006.01)
*H01L 51/52* (2006.01)

(56) References Cited

U.S. PATENT DOCUMENTS

| | | | |
|---|---|---|---|
| 2013/0248891 A1* | 9/2013 | Kim | H01L 51/0097 257/88 |
| 2014/0054555 A1* | 2/2014 | Kim | H01L 27/322 257/40 |
| 2015/0102324 A1 | 4/2015 | Lee | |

OTHER PUBLICATIONS

Chinese Office Action dated Aug. 3, 2018 for corresponding Chinese Patent Application No. 201710353681.3, with partial English translation.

* cited by examiner

DISPLAY DEVICE

CLAIM OF PRIORITY

The present application claims priority from Japanese Patent Application No. 2016-100485 filed on May 19, 2016, the content of which is hereby incorporated by reference into this application.

BACKGROUND OF THE INVENTION

(1) Field of the Invention

The present invention relates to a display device, and more particularly, to a flexible display device which allows the substrate to be bent. The present invention further relates to the flexible display device configured to employ an oxide semiconductor for the TFT.

(2) Description of the Related Art

The organic EL display device and the liquid crystal display device may be configured to reduce the display device thickness so as to be used while being flexibly bent. In this case, the thin glass or the thin resin may be used for forming the substrate that constitutes the device. The organic EL display device which employs no backlight is more suitable for thinning.

The liquid crystal display device or the organic EL display device has a layer structure including a large number of layers of various types, for example, the conductive layer, the inorganic insulating layer, the organic insulating layer, the semiconductor layer, and the like Laminating layers each exhibiting different thermal expansion coefficient may cause stress in the film, leading to crack and separation in the thin film.

Japanese Unexamined Patent Application Publication No. 2004-317649 discloses the laminated structure obtained by interposing $SiOx_2$ and $Cr_2O_3$ films between the organic insulating film and the ITO (Indium Tin Oxide) for the purpose of alleviating the interlayer stress resulting from formation of the organic insulating film and the ITO.

SUMMARY OF THE INVENTION

The TFT (Thin Film Transistor) is employed for controlling signals applied to the pixel. Such materials as a-Si (Amorphous-Si) and Poly-Si have been used for forming the TFT. Meanwhile, recently, use of the TFT constituted by the oxide semiconductor featured by small leak current has been receiving a lot of attention because the pixel electrode voltage can be stably retained for a prolonged period of time. However, the oxide semiconductor is weak to moisture and hydrogen.

Meanwhile, the organic EL material for forming the light emitting layer of the organic EL display device will be decomposed in the presence of moisture, resulting in deteriorated performance. Accordingly, the organic EL layer has to be protected from moisture in order to ensure operating life. The barrier against moisture is implemented by using the laminated film of SiOx (denoting $SiO_2$ in the description as the basic structure, generally indicating deviation from stoichiometry of x=2), or SiNx (denoting $Si_3N_4$ in the description as the basic structure, generally indicating deviation from the stoichiometry of x=4/3).

The use of the laminated film made of SiOx or SiNx is still insufficient to provide the barrier performance against the moisture and hydrogen. It is an object of the present invention to provide the long-life display device configured to protect the TFT and the organic EL layer from moisture and hydrogen.

The present invention may be exemplified by the structure as described below.

(1) An organic EL display device includes a TFT formed on a substrate, and an organic EL layer formed on the TFT. A protective layer is formed on the organic EL layer, and a first barrier layer which contains AlOx is formed between the substrate and the TFT (2) In the organic EL display device as described in (1), the first barrier layer is formed into a laminated structure of a first AlOx and a second AlOx.

(3) A liquid crystal display device includes a TFT and a pixel electrode formed on a first substrate, a counter substrate disposed opposite to the first substrate, and a liquid crystal interposed between the first substrate and the second substrate. A first barrier layer which contains AlOx is formed between the TFT and the first substrate.

(4) In the liquid crystal display device as described in (3), the first barrier layer is formed into a laminated structure of a first AlOx and a second AlOx.

DETAILED DESCRIPTION OF THE PREFERRED EMBODIMENTS

The present invention will be described in detail referring to the following embodiments.

First Embodiment

Figure 1:
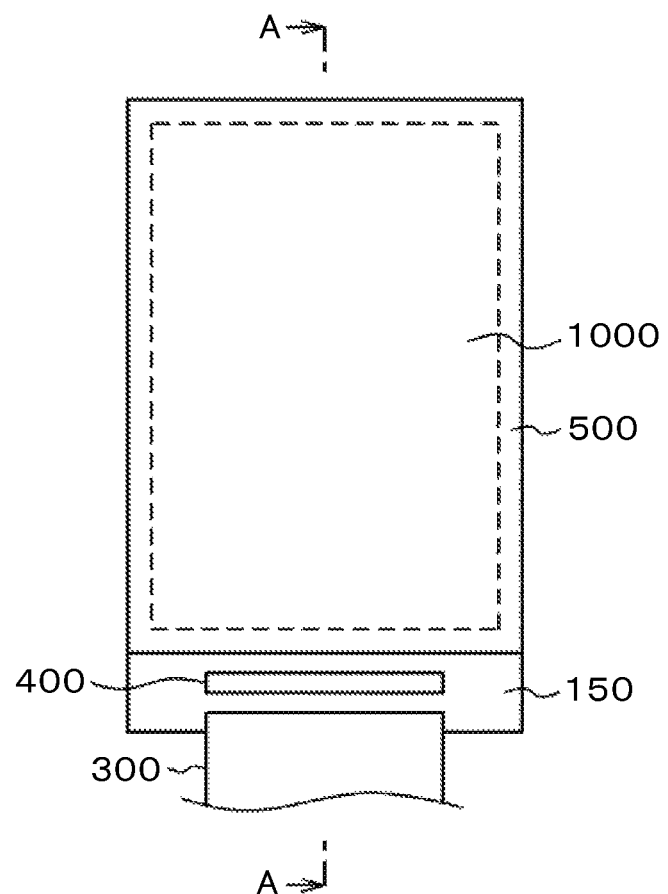
FIG. 1 is a plan view of an organic EL display device.

FIG. 1 is a plan view of the organic EL display device to which the present invention is applied. The organic EL display device according to the present invention is configured to be flexibly bent. Referring to FIG. 1, the organic EL display device includes a display region 1000 and a terminal part 150. A polarizing plate 500 is bonded to the display region 1000 for antireflection purpose. A flexible wiring substrate 300 is connected to the terminal part 150 for supplying power and signals to the organic EL display device. A driver IC 400 is also connected to the terminal part 150 for driving the organic EL display device.

Figure 2:
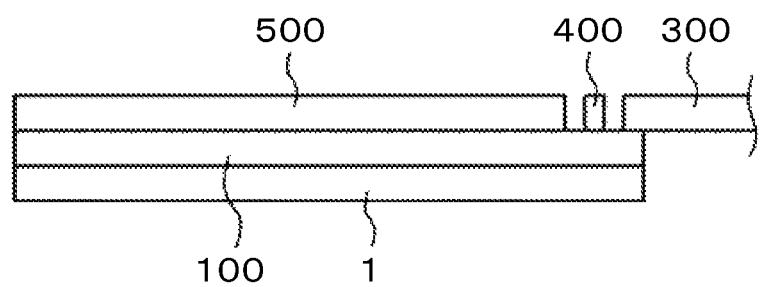
FIG. 2 is a sectional view taken along line A-A of FIG. 1.

FIG. 2 is a sectional view taken along line A-A of FIG. 1. The display region and the terminal part are formed on a polyimide substrate 100. The polyimide substrate 100 has a thickness from 10 µm to 20 µm, which can be flexibly bent. Since the polyimide substrate 100 is thin to make its shape unstable, and mechanical strength insufficient, a first protective film 1 is applied to a back surface of the substrate. The first protective film 1 is made of PET (polyethylene terephthalate), or an acrylic resin, having a thickness of approximately 0.1 mm.

Referring to FIG. 2, an array layer having a light emitting layer is formed on the polyimide substrate 100, on which the polarizing plate 500 is disposed to cover the layer. The organic EL display device of top emission type includes a reflection electrode so as to reflect external light. The polarizing plate 500 serves to help the user view the screen by preventing reflection of the external light.

Figure 3:
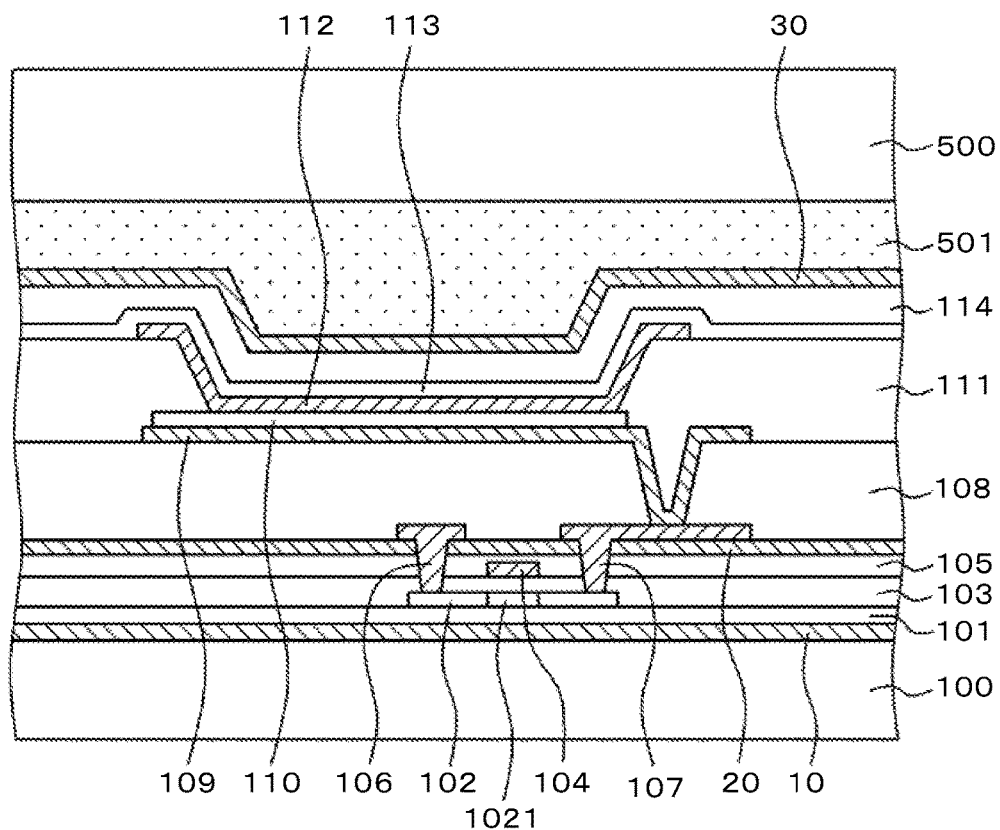
FIG. 3 is a sectional view of a display region of the organic EL display device.

FIG. 3 is a sectional view showing structure of the display region of the organic EL display device of top emission type according to the present invention. FIG. 3 omits the first protective film 1 as shown in FIG. 2. Referring to FIG. 3, a first barrier layer 10 made of AlOx, or the like is formed on the polyimide substrate 100 having the thickness ranging from 10 µm to 20 µm. In the description, the AlOx is regarded as the term having $Al_2O_3$ as the basic structure, which generally refers to deviation from the stoichiometry of x=1.5. The first barrier layer 10 serves to prevent external penetration of moisture through the polyimide substrate 100, or penetration of moisture or hydrogen generated in the polyimide substrate 100 by itself.

A base film 101 made of SiOx, SiNx, or the like is formed on the first barrier layer 10 through the CVD. A semiconductor layer 102 is formed on the base film 101. The semiconductor layer 102 as shown in FIG. 3 is constituted by the oxide semiconductor. The oxide semiconductor may be, for example, a-IGZO (amorphous Indium Gallium Zinc Oxide), or the like. The oxide semiconductor is featured by small leak current. Meanwhile, the Poly-Si semiconductor layer may be used for forming the TFT as shown in FIG. 3. In this case, the semiconductor layer 102 can be primarily produced by forming the a-Si through the CVD first, which is then converted into Poly-Si through excimer laser.

A gate insulating film 103 made of SiOx derived from TEOS (tetraethoxysilane) through the CVD is formed while covering the semiconductor layer 102. A gate electrode 104 is formed on the gate insulating film 103. Thereafter, the part of the semiconductor layer 102 besides the region corresponding to the gate electrode 104 is formed into a conductive layer through ion implantation. The part of the semiconductor layer 102, which corresponds to the gate electrode 104 becomes a channel part 1021.

An interlayer insulating film 105 is made of SiNx through the CVD while covering the gate electrode 104. A second barrier layer 20 made of AlOx is formed on the interlayer insulating film 105. The second barrier layer 20 serves to protect the TFT constituted by the oxide semiconductor from moisture and hydrogen, and to protect an organic EL layer 112 from moisture, hydrogen, and the like from the polyimide substrate 100.

Then through holes are formed in the second barrier layer 20, the interlayer insulating film 105, and the gate insulating film 103 so as to connect a drain electrode 106 and a source electrode 107. Referring to FIG. 3, an organic passivation film 108 is formed while covering the drain electrode 106, the source electrode 107, and the second barrier layer 20. The organic passivation film 108 serving as a flattening film is made thick in the range from 2 µm to 3 µm. For example, the acrylic resin may be used for forming the organic passivation film 108.

A reflection electrode 109 is formed on the organic passivation film 108, on which a lower electrode 110 is formed as an anode, which is made of transparent conductive film such as ITO. The Al alloy with high reflectivity is used for forming the reflection electrode 109. The reflection electrode 109 is connected to the source electrode 107 of the TFT via the through hole formed in the organic passivation film 108.

A bank 111 made of acryl or the like is formed around the lower electrode 110. The bank 111 is provided in order to prevent conduction failure caused by step-cut of the organic EL layer 112 including the light emitting layer and an upper electrode 113, which are formed in the subsequent step. The bank 111 is formed by applying a transparent resin such as the acrylic resin over the entire surface, and forming the hole in the part corresponding to the lower electrode 110 for taking light from the organic EL layer.

Referring to FIG. 3, the organic EL layer 112 formed on the lower electrode 110 is constituted by an electron injection layer, an electron transport layer, a light emitting layer, a hole transport layer, a hole injection layer, and the like. The upper electrode 113 as a cathode formed on the organic EL layer 112 is constituted by an IZO (Indium Zinc Oxide), an ITO (Indium Tin Oxide), and the like as the transparent conductive film. It may also be constituted by a thin metal film such as silver.

Then, a protective layer 114 made of SiN through the CVD is formed on the upper electrode 113 for the purpose of preventing penetration of moisture from the side of the upper electrode 113. As the organic EL layer 112 is weak to heat, the protective layer 114 is formed through the CVD at low temperature of approximately 100° C.

A third barrier layer 30 made of AlOx or the like is formed while covering the protective layer 114. The third barrier layer 30 serves to protect the organic EL layer 112 from moisture which penetrates the polarizing plate 500 and the like, together with the protective layer 114.

The polarizing plate 500 is bonded with an adhesive material 501 to cover the third barrier layer 30. The polarizing plate 500 serves to prevent reflection of external light. Any other type of protective layer or the protective film may be formed between the polarizing plate 500 and the third barrier layer 30 depending on the product type.

Figure 4:
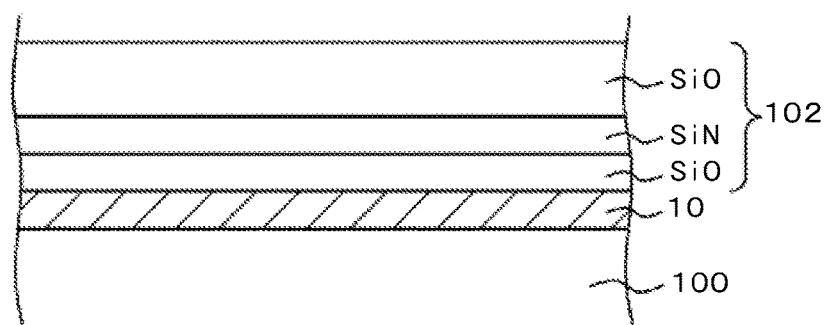
FIG. 4 is a sectional view showing an example of a barrier layer.

FIG. 4 is a sectional view of the part around the first barrier layer 10 as shown in FIG. 3. Referring to FIG. 4, the first barrier layer 10 is formed on the polyimide substrate 100. The polyimide substrate 100 which contains moisture may become the hydrogen source. The polyimide has the property that is likely to allow moisture penetration. In order to block the above-described moisture and hydrogen, the first barrier layer 10 made of AlOx is provided. The dense AlOx exhibiting high block performance with thickness from approximately 30 nm to 80 nm may provide sufficient block effect. The first barrier layer 10 made of AlOx as shown in FIG. 4 is derived from sputtering.

Referring to FIG. 3, the second barrier layer 20 is formed on the interlayer insulating film 105 made of SiN, and the third barrier layer 30 is formed on the protective layer 114 made of SiN. Although each contact layer of the second barrier layer 20 and the third barrier layer 30 is different from that of the first barrier layer 10, such layer serves to prevent moisture and hydrogen from externally reaching the TFT and the organic EL layer.

Figure 5:
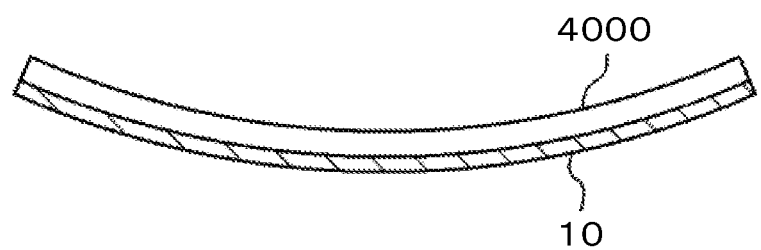
FIG. 5 is a sectional view showing an example of disadvantage resulting from the structure as shown in FIG. 4.

Generally, AC sputtering is employed for forming AlOx. The film formed through the AC sputtering will grow until the film stress reaches magnitude of GPa (Giga Pascal). The aforementioned state may bend the substrate as FIG. 5 schematically shows. Bending of a large mother substrate 4000 upon sputtering of AlOx may cause the serious problem. The largely bent mother substrate 4000 is no longer available for the manufacturing process.

The DC sputtering may reduce the film stress, but fail to increase the film thickness of AlOx. Meanwhile, the AlOx formed through the process of atomic deposition layer (ADL) may reduce the film stress, but exhibit the low film production rate.

Figure 6:
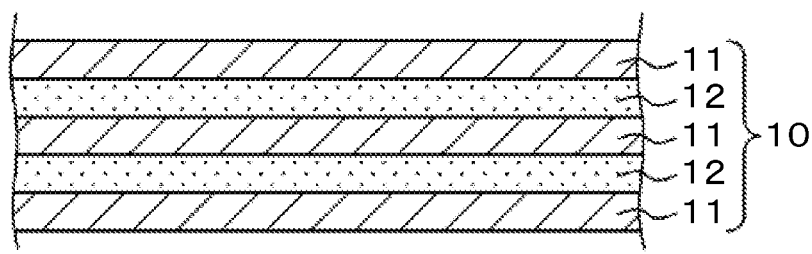
FIG. 6 is an exemplified sectional view showing a barrier layer according to the present invention.

In order to solve the aforementioned disadvantage, the present invention is configured to produce the first barrier layer 10 by laminating the first AlOx 11 and the second AlOx 12 each having different film quality as shown in FIG. 6. The first AlOx 11 is produced through sputtering at the low $H_2O$ pressure, and the AlOx 12 as shown in FIG. 2 is produced at the $H_2O$ pressure higher than the pressure at which the first AlOx is produced. The first AlOx 11 and the second AlOx 12 are produced so that the resultant films exhibit stress signs opposite to each other. This makes it possible to lower the overall stress of the barrier layer 10.

Figure 7:
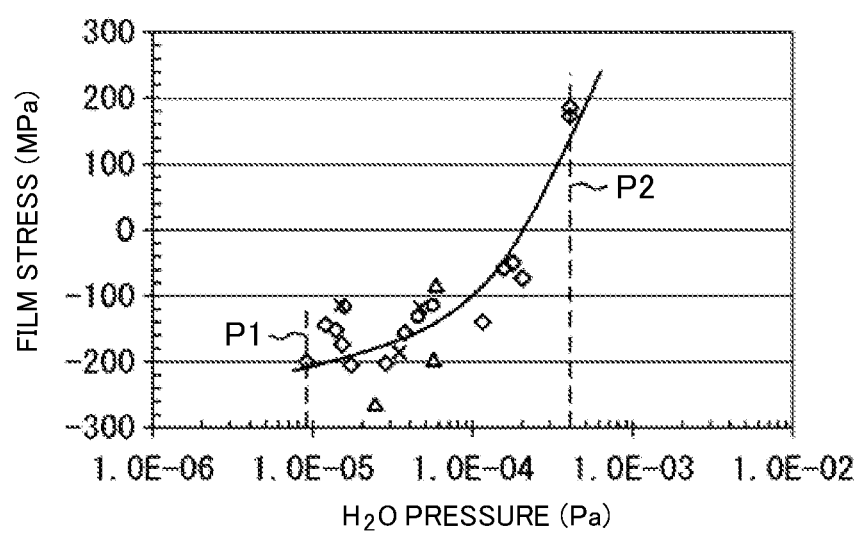
FIG. 7 is a graph representing a relationship between $H_2O$ pressure and a film stress in sputtering.

FIG. 7 is a graph indicating the relationship between the $H_2O$ pressure upon sputtering and the film stress of the produced AlOx film. As shown in FIG. 7, the x-axis denotes the $H_2O$ pressure upon sputtering, and the y-axis denotes the film stress of the produced AlOx film. Referring to FIG. 7, as the $H_2O$ pressure becomes higher, the sign of the film stress is switched from negative to positive.

As FIG. 7 shows, the film stress becomes zero at the $H_2O$ pressure of approximately $2 \times 10^4$ Pa. In other words, from a limited view point of the film stress, the film produced through sputtering at the $H_2O$ pressure of approximately $2 \times 10^{-4}$ Pa is available. The AlOx film quality may vary depending on the $H_2O$ pressure in sputtering. Specifically, the lower the $H_2O$ pressure becomes, the denser the film may be obtained. The AlOx derived from sputtering at the $H_2O$ pressure of approximately $2 \times 10^{-4}$ Pa may fail to exhibit sufficient barrier property.

The present invention allows the use of the laminated structure constituted by laminating the first AlOx with high barrier property derived from sputtering at low $H_2O$ pressure, and the second AlOx derived from sputtering at the $H_2O$ pressure higher than the one at which the first AlOx is produced. This makes it possible to produce the barrier layer constituted by the AlOx with lower stress while retaining excellent barrier property.

As the film stress of the second AlOx has its sign opposite to that of the first AlOx, the overall film stress of the laminated film constituted by the first AlOx and the second AlOx may be regarded as being small Because of high barrier property, the first AlOx becomes the first barrier layer with high barrier property.

For example, as FIG. 7 shows, the $H_2O$ pressure is set to P1 (approximately $9 \times 10^{-6}$ Pa) for forming the first AlOx, and the $H_2O$ pressure is set to P2 (approximately $4 \times 10^{-4}$ Pa) for forming the second AlOx so that values of the film stress of the first AlOx 11 and the second AlOx 11 become −200 MPa and 180 MPa, respectively. The overall film stress of the first barrier layer 10 may be made very small. This makes it possible to prevent warpage of the substrate. The first AlOx 11 is allowed to impart high barrier property to the first barrier layer 10 as a whole.

Figure 8:
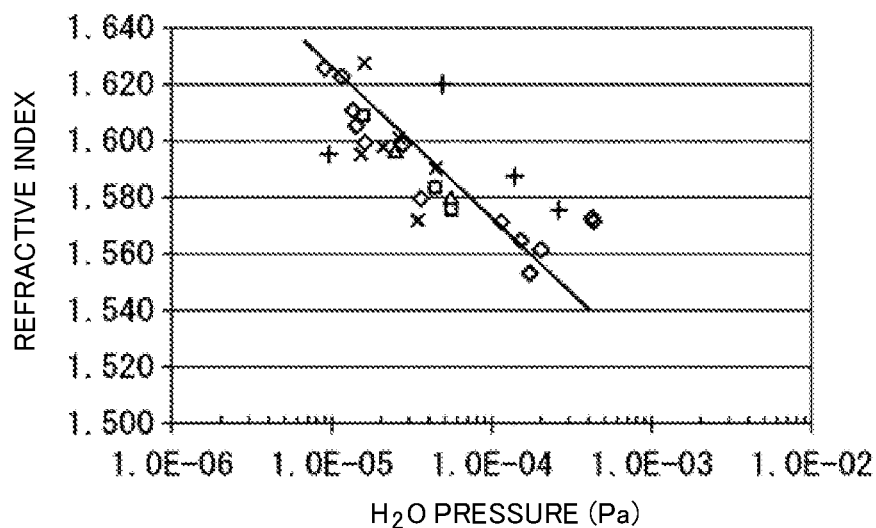
FIG. 8 is a graph representing a relationship between $H_2O$ pressure and a refractive index in sputtering.

There is a correlation between density and refractive index of the AlOx film. That is, as the film becomes denser, the refractive index becomes higher. FIG. 8 is a graph showing the relationship between the $H_2O$ pressure upon sputtering of the AlOx, and the refractive index of the produced AlOx. Specifically, the film quality of the AlOx may be evaluated by measuring the refractive index of the produced AlOx film. Such marks as ○, △, X, □ shown in FIGS. 7 and 8 represent different sample production lots.

Referring to FIG. 6, the first AlOx 11 is 10 nm thick, and the second AlOx 12 is 10 nm thick so that the overall thickness of the first barrier layer 10 is 50 nm. The laminated structure of FIG. 6 is a mere example, and accordingly, it is possible to set each film thickness to the value besides 10 nm. It is also possible to increase the number of layers to be more than five, or decrease the number of layers. Preferably, the total number of layers is an odd number, and each of the outer layers is constituted by the first AlOx 11.

The film with laminated structure constituted by the first AlOx 11 and the second AlOx 12 as shown in FIG. 6 may be easily produced. That is, the AlOx is produced through reactive sputtering using gas such as oxygen and Ar while setting Al as the target. Each $H_2O$ pressure in sputtering may be varied upon production of the first AlOx and the second AlOx.

According to the embodiment, the $H_2O$ pressure is controlled to change the AlOx film property. However, it is possible to introduce hydrogen bond to the AlOx film by using alkane such as hydrogen and methane, resulting in similar effects to those derived from the embodiment.

Figure 9:
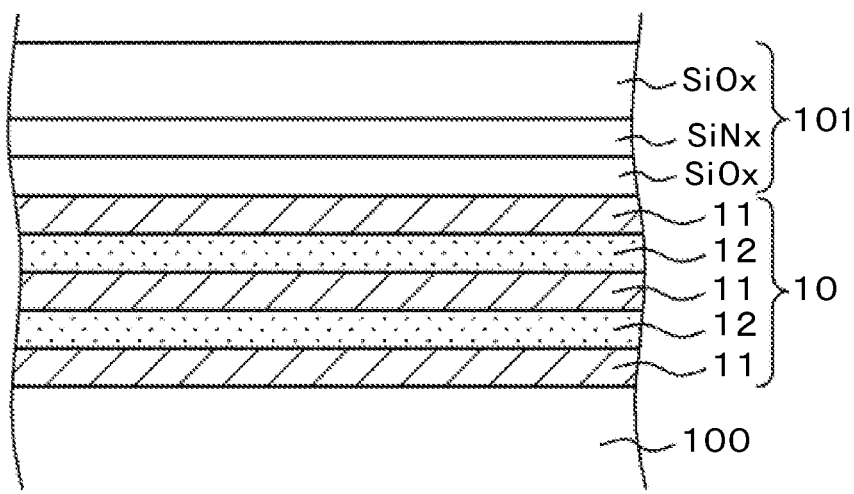
FIG. 9 is a sectional view showing a detailed example of a first barrier layer and a base film.

FIG. 9 shows structure of the part around the first barrier layer 10 as shown in FIG. 3. The first barrier layer 10 has been explained referring to FIG. 6. The base film 101 formed on the first barrier layer 10 has a laminated structure constituted by SiOx (50 nm), SiNx (50 nm), SiOx (300 nm), for example.

Figure 10:
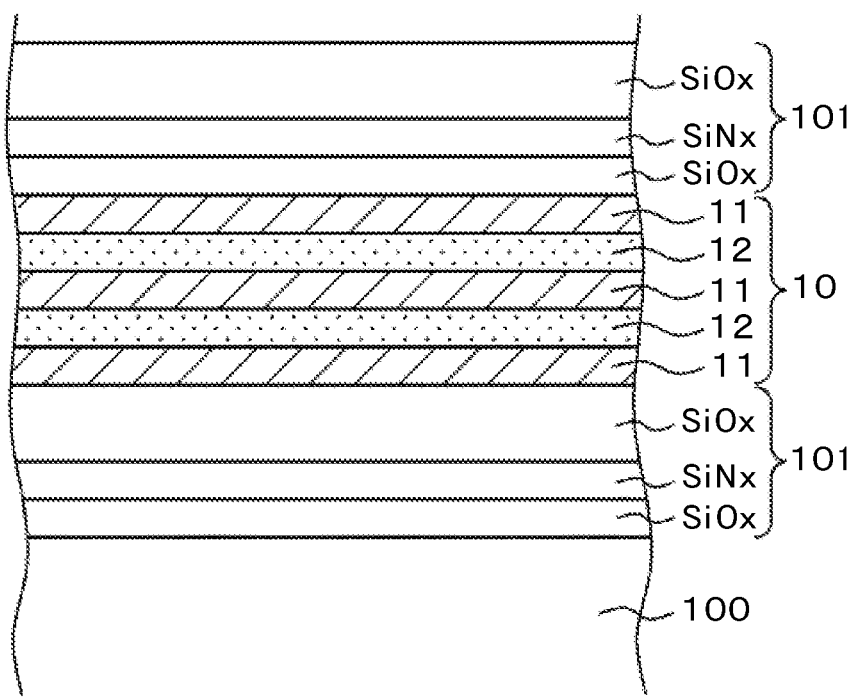
FIG. 10 is a sectional view showing another detailed example of the first barrier layer and the base film.

The layer of the part around the first barrier layer 10 may have any other structure as shown in FIG. 10, for example. As FIG. 10 shows, the first barrier layer 10 is sandwiched between upper and lower layer sets of SiOx (50 nm), SiNx (50 nm), and SiOx (300 nm). The aforementioned structure may improve the film quality of the first AlOx 11 of the first barrier layer 10. The SiOx layer and SiNx layer may have any other structures with respect to thickness and arrangement with no limitation to those shown in FIGS. 9 and 10.

The description of the present invention has been made with respect to the first barrier layer 10 as shown in FIG. 3. This applies to both the second barrier layer 20 and the third barrier layer 30.

Second Embodiment

Figure 11:
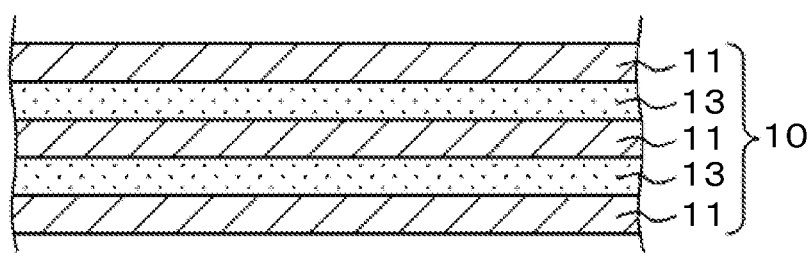
FIG. 11 is a sectional view showing an example of a barrier layer according to a second embodiment.

FIG. 11 is a sectional view showing the structure of the first barrier layer 10 according to the second embodiment. The first barrier layer 10 as shown in FIG. 11 has the laminated structure constituted by layers of the first AlOx 11 and an Al 13. Specifically, this embodiment is different from the first embodiment in that the second AlOx 12 as shown in FIG. 6 is replaced with the Al 13. As FIG. 11 shows, each of odd-numbered layers is formed as the AlOx 11, and each of even-numbered layers is formed as the Al 13.

The film stress of the odd-numbered AlOx 11 will be absorbed by the even-numbered Al 13 so as to reduce the film stress of the first barrier layer 10 as a whole. The Al 13 formed adjacent to the AlOx 11 may further density the film quality of the sputtered AlOx.

The film having the laminated structure constituted by the AlOx 11 and Al 13 as shown in FIG. 11 may be easily produced. Specifically, the AlOx 11 is produced by the reactive sputtering process using such gas as oxygen and Ar while setting Al as the target, and the Al 13 is produced using such gas as Ar while setting Al as the target. Accordingly, the film with the laminated structure may be produced by using different kind of gas upon formation of the respective films.

The Al layer 13 which exists in the structure of the barrier layer as shown in FIG. 11 may make light transmission difficult. Therefore, the structure as shown in FIG. 11 may be applied to the first barrier layer 10 and the second barrier layer 20, but have difficulty in application to the third barrier layer 30.

Referring to FIG. 11, for example, each film thickness of the first AlOx 11 and the Al 13 is 10 nm, and the film has the five-layered structure. However, the film thickness and the number of layers do not have to be limited to those shown in FIG. 11. The embodiment provides another advantage that the conductive layer of the Al 13 may be used in the process for antistatic purpose.

The embodiment has another advantage of automatically preventing electrification of the sputtering chamber owing to the conductive film formed therein on a regular basis. Specifically, the sputtering apparatus will accumulate static electricity therein as only the insulating film sputtering proceeds, resulting in damage to the product. For this reason, the sputtering apparatus is required to execute the conductive film sputtering process on the regular basis for preventing electrification inside the apparatus. The film formation according to the embodiment includes the process for forming the conductive film on the regular basis. Therefore, addition of the conductive film sputtering process is not necessary.

As described above, this embodiment is capable of protecting the TFT and the organic EL layer from moisture and hydrogen, and preventing warpage of the substrate simultaneously.

Third Embodiment

Figure 12:
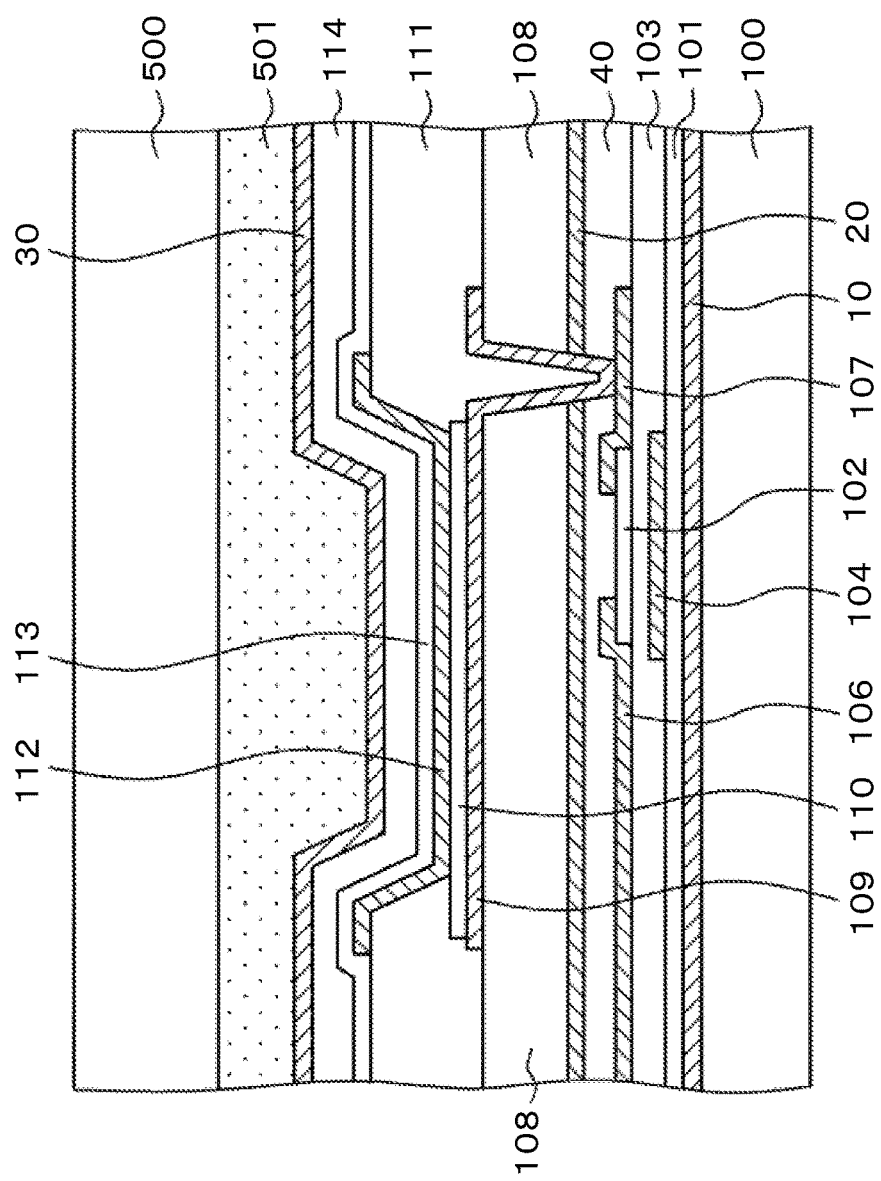
FIG. 12 is a sectional view of an organic EL display device according to the present invention when using TFT of bottom gate type.

FIG. 12 is a sectional view showing the present embodiment, specifically, in the case that the TFT of the organic EL display device is of bottom gate type. Referring to FIG. 12, the first barrier layer 10 made of AlOx or the like is formed on the polyimide substrate 100. The base film 101 is formed on the first barrier layer 10. The gate electrode 104 is formed on the base film 101, and the gate insulating film 103 is formed while covering the gate electrode. The semiconductor layer 102 constituted by the oxide semiconductor or a-Si is formed on the gate insulating film 103 at the part corresponding to the gate electrode 104.

The drain electrode 106 and the source electrode 107 are connected to the semiconductor layer 102. An inorganic passivation film 40 made of SiN or the like is formed while covering the semiconductor layer 102, the drain electrode 106, and the source electrode 107. The second barrier layer 20 made of AlOx or the like is formed on the inorganic passivation film 40. The organic passivation film 108 is formed on the second barrier layer 20, and the reflection electrode 109 is formed on the organic passivation film 108. The reflection electrode 109 is connected to the source electrode 107 of the TFT via the through hole. The subsequent process is the same as the one as shown in FIG. 3.

The first barrier layer 10 as shown in FIG. 12 has the same structure as the one described in the first embodiment referring to FIGS. 4 to 10, or FIGS. 6 to 10. In other words, the present invention may be applied to the TFT of bottom gate type so as to ensure lessening of the influence of moisture and hydrogen on the organic EL layer 112, the TFT, and the like, and further ensure prevention of warpage of the substrate 100.

Each of the second barrier layer 20 and the third barrier layer 30 as shown in FIG. 12 has the same structure as the one described in the first embodiment. The laminated structure constituted by AlOx and Al as shown in FIG. 11 according to the second embodiment may be applied to the present embodiment.

Fourth Embodiment

Figure 13:
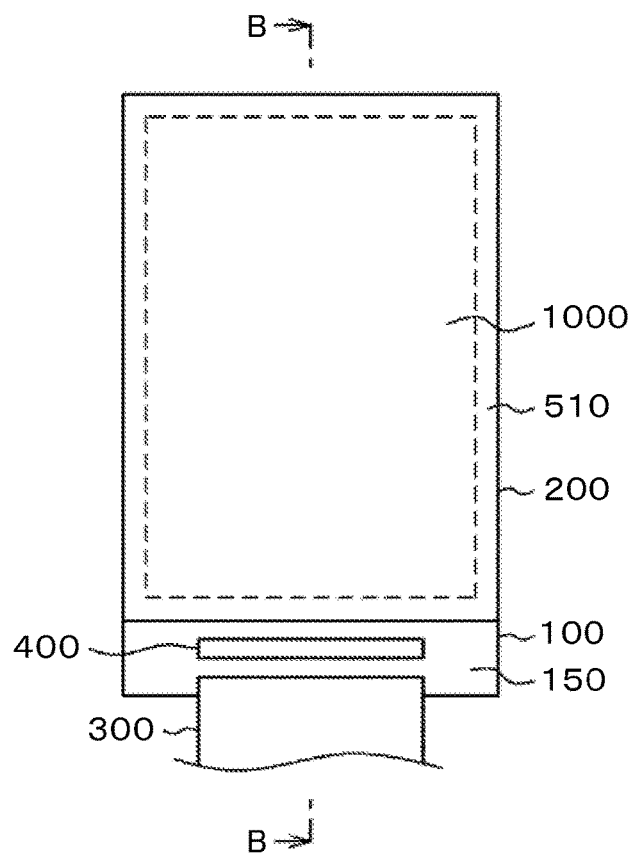
FIG. 13 is a plan view of a liquid crystal display device.

The present invention is applicable to the liquid crystal display device. FIG. 13 is a plan view of the liquid crystal display device. Referring to FIG. 13, the display region 1000 is formed on a counter substrate 200 which faces the TFT substrate 100, and an upper polarizing plate 510 is disposed while covering the display region 1000. The terminal part 150 is connected to the driver IC 400 and the flexible wiring substrate 300.

Figure 14:
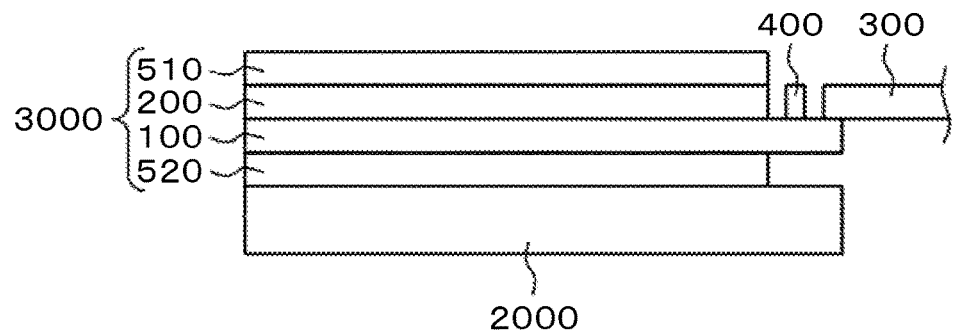
FIG. 14 is a sectional view taken along line B-B of FIG. 13.

FIG. 14 is a sectional view taken along line B-B of FIG. 13. Referring to FIG. 14, the TFT substrate 100 and the counter substrate 200 are arranged, facing with each other, which have liquid crystal interposed therebetween. The upper polarizing plate 510 is applied onto the counter substrate 200, and a lower polarizing plate 520 is applied to the lower surface of the TFT substrate 100. A liquid crystal display panel 3000 is constituted by the TFT substrate 100, the counter substrate 200, the upper polarizing plate 510, and the lower polarizing plate 520. A backlight 2000 is disposed at the lower side of the lower polarizing plate 520.

Referring to FIG. 14, use of the thin resin or thin glass for forming the TFT substrate 100 or the counter substrate 200 allows the liquid crystal display panel 3000 to have a flexibly bendable structure. The backlight 2000 including the light source, the light guide plate, the optical sheet, and the like is also configured to be flexible by using the thin resin for forming the light guide plate so that the overall liquid crystal display device becomes the flexible display device.

Figure 15:
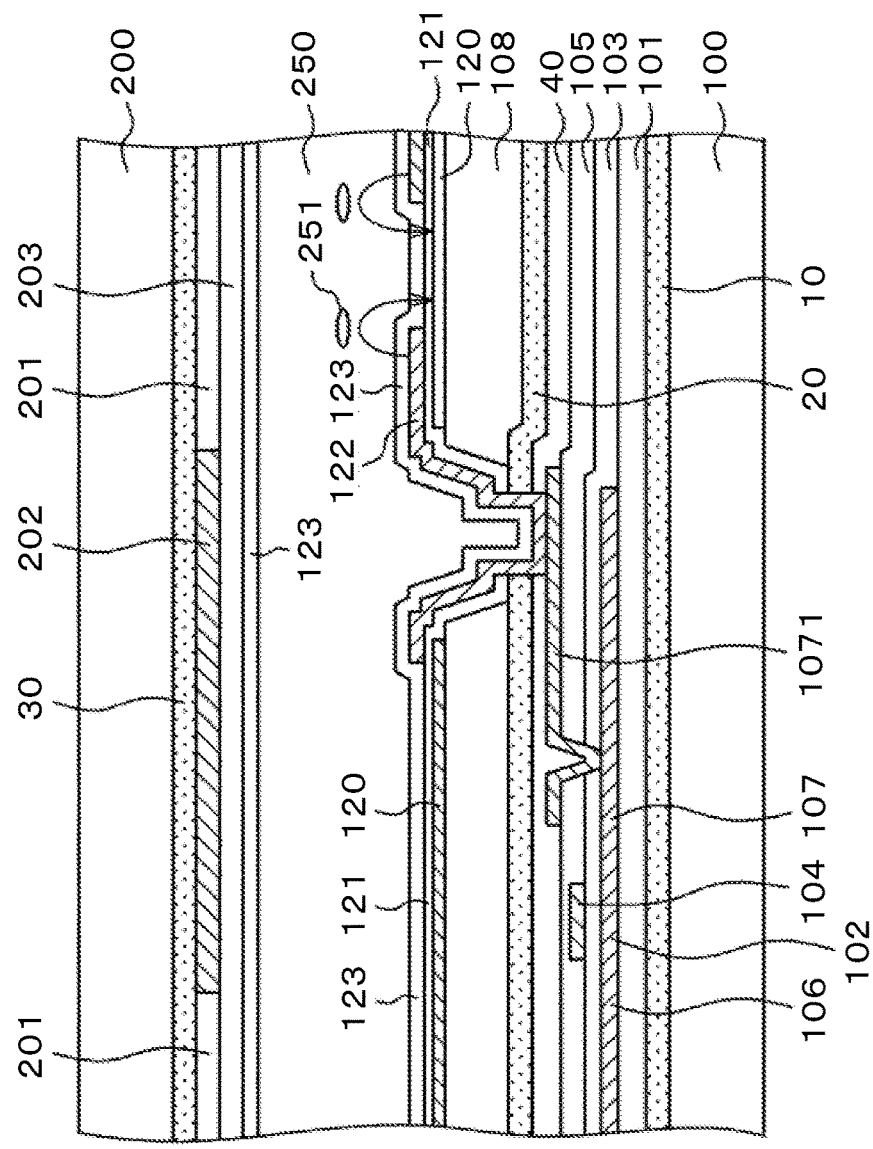
FIG. 15 is a sectional view showing the liquid crystal display device according to the present invention when using TFT of top gate type.

FIG. 15 is a sectional view of the display region of the liquid crystal display device. As FIG. 15 shows, the liquid crystal display device is of IPS (In Plane Switching) type. The TFT for driving the liquid crystal is constituted by the oxide semiconductor. The present invention provides the barrier layer made of AlOx or the like for the purpose of protecting the oxide semiconductor from the externally penetrating moisture, or hydrogen generated in the material for forming the component. FIG. 15 shows the TFT of top gate type.

Referring to FIG. 15, for example, the first barrier layer 10 which contains AlOx is formed on the polyimide TFT substrate 100. The first barrier layer 10 is similarly structured to the one as described in the first embodiment referring to FIGS. 4 to 10. The structure is capable of protecting the TFT from externally penetrating moisture, or moisture, hydrogen, and the like generated in the polyimide substrate 100.

The base film 101 made of SiOx or SiNx is formed on the first barrier layer 10. Basically, the TFT formed on the base film 101 has the same structure as the one described in the first embodiment. Specifically, the semiconductor layer 102 constituted by the oxide semiconductor is formed on the base film 101, and the gate insulating film 103 made of SiOx derived from TEOS covers the semiconductor layer 102. The gate electrode 104 is formed on the gate insulating film 103, and the interlayer insulating film 105 made of SiNx through the sputtering process is formed while covering the gate electrode.

A contact electrode 1071 is formed on the interlayer insulating film 105. The contact electrode 1071 is connected to the drain electrode 107 of the TFT via the through hole, and connected to a pixel electrode 122 via the through hole. The drain electrode 106 as shown in FIG. 15 is connected to the video signal line. Referring to FIG. 15, the inorganic passivation film 40 made of SiNx is formed on the interlayer insulating film 105, for example, and the second barrier layer 20 which contains AlOx is formed on the inorganic passivation film. The second barrier layer 20 protects the TFT from moisture and hydrogen penetrating from above in cooperation with the inorganic passivation film 40. Basically, the second barrier layer 20 also has the same structure as that of the first barrier layer 10.

The organic passivation film 108 serving as a flattening film is formed on the second barrier layer 20. A common electrode 120 is planarly formed on the organic passivation film 108, and a capacitance insulating film 121 is formed on the common electrode. The pixel electrode 122 is formed on the capacitance insulating film. The pixel electrode 122 is connected to the contact electrode 1071 via the through hole. The capacitance insulating film 121 constitutes the storage capacitor together with the pixel electrode 122 and the common electrode 120. Referring to FIG. 15, upon application of voltage to the pixel electrode 122, the electric force line indicated by arrows is generated between the pixel electrode and the common electrode 120 for driving liquid crystal molecules 251. An alignment film 123 is formed on the pixel electrode 122 for initial alignment of the liquid crystal molecules 251.

As FIG. 15 shows, the counter substrate 200 is disposed opposite to the TFT substrate while interposing a liquid crystal layer 250. The counter substrate 200 is also made of polyimide, and has the third barrier layer 30 made of AlOx at the inner side. The third barrier layer 30 serves to block moisture penetrating through the polyimide substrate 200, or moisture, hydrogen, and the like generated in the polyimide substrate 200. In FIG. 15, the third barrier layer 30 only includes the barrier layer. The barrier property may further be improved by forming the barrier layer simultaneously with formation of the inorganic insulating layer made of SiOx or SiNx according to the first embodiment as shown in FIGS. 9 and 10.

As FIG. 15 shows, a black matrix 202 and a color filter 201 are formed on the third barrier layer 30, and an overcoat film 203 is formed while covering the color filter 201. The alignment film 123 is formed while covering the overcoat film 203 for initial alignment of the liquid crystal molecules 251.

The first barrier layer 10, the second barrier layer 20, and the third barrier layer 30 constitute the AlOx laminated structure as described in the first embodiment referring to FIG. 6. Therefore, this embodiment is capable of preventing moisture and hydrogen from influencing the liquid crystal layer or the oxide semiconductor, and suppressing warpage of the substrate.

In the case that the laminated structure of AlOx and Al is constituted by the first barrier layer 10, the second barrier layer 20, and the third barrier layer 30 as described in the second embodiment referring to FIG. 11, the backlight no longer transmits light in the presence of Al. Meanwhile, the liquid crystal display device of reflection type allows the first barrier layer 10 and the second barrier layer 20 to have the structure as described in the second embodiment referring to FIG. 11.

Fifth Embodiment

Figure 16:
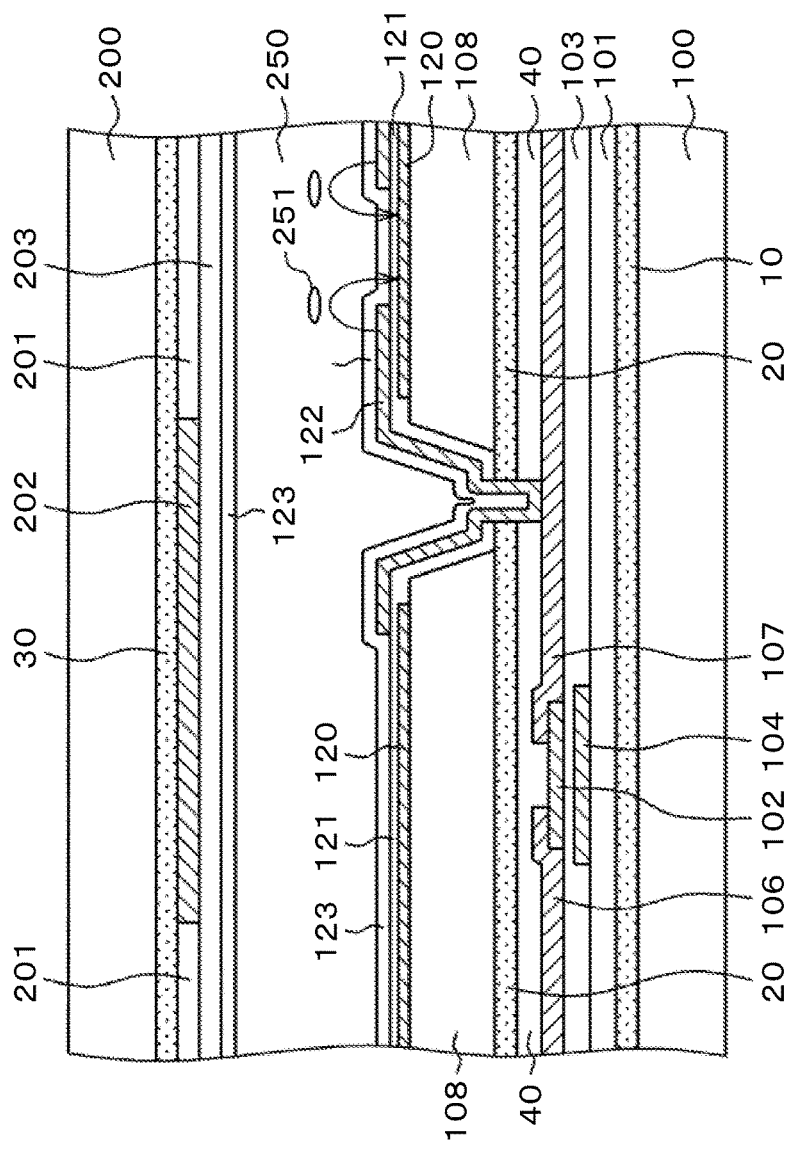
FIG. 16 is a sectional view showing the liquid crystal display device according to the present invention when using TFT of bottom gate type.

FIG. 16 is a sectional view showing a fifth embodiment of the present invention. Referring to the sectional view of the display region of the liquid crystal display device as shown in FIG. 16, the TFT is of bottom gate type, which is different from the TFT as shown in FIG. 15. Referring to FIG. 16, likewise the structure as shown in FIG. 15, the first barrier layer 10 which contains AlOx is formed on the polyimide TFT substrate 100, and the base film 101 is formed on the first barrier layer. The first barrier layer 10 also has the same structure as the one described in the first embodiment referring to FIGS. 4 to 10.

Referring to FIG. 16, the gate electrode 104 is formed on the base film 101. The gate insulating film 103 is formed while covering the gate electrode 104. The semiconductor layer 102 constituted by the oxide semiconductor is formed on the gate insulating film 103 corresponding to the gate electrode 104. The drain electrode 106 and the source electrode 107 are formed on the semiconductor layer 102, which are arranged opposite to each other. The inorganic passivation film 40 is formed while covering the semiconductor layer 102, the drain electrode 106, and the source electrode 107, on which the second barrier layer 20 is formed.

The organic passivation film 108 is formed while covering the second barrier layer 20. The layer configuration above the organic passivation film 108 is analogous to that of the liquid crystal display device as shown in FIG. 15, having the TFT of top gate type as described in the fourth embodiment. Specifically, the third barrier layer 30 made of AlOx is formed at the side of the counter substrate 200 as shown in FIG. 16 for preventing penetration of moisture through the polyimide substrate 200, or moisture and hydrogen generated therein into the liquid crystal layer 250 or the semiconductor layer 102.

Basically, each structure of both the second barrier layer 20 and the third barrier layer 30 is the same as that of the barrier layer described in the first embodiment referring to FIGS. 4 to 10. Accordingly, this embodiment is capable of preventing moisture and hydrogen from influencing the liquid crystal layer 250 or the semiconductor layer 102, and further suppressing warpage of the substrate. The first barrier layer 10 and the second barrier layer 20 of the liquid crystal display device of reflection type may have the same structure as the one shown in FIG. 11.

The present invention has been exemplified by the organic EL display device, and the liquid crystal display device as described in the embodiments referring to the sectional views. However, it is possible to implement the present invention to have different structures. For example, the organic EL display device as shown in FIG. 3 is allowed to include other supporting film or the like between the polarizing plate 500 and the third barrier layer 30, or to form the third barrier layer 30 on the upper electrode 113, on which the protective layer 114 is further formed. With respect to the organic EL display device according to the first to the third embodiments, and the liquid crystal display device according to the fourth and the fifth embodiments, it is also possible to use any other resin or glass, in place of polyimide, for forming the TFT substrate 100 or the counter substrate 200.

What is claimed is:

1. An organic EL display device having a TFT formed on a substrate, and an organic EL layer formed on the TFT, wherein
   a protective layer is formed on the organic EL layer,
   a first barrier layer which contains AlOx layer is formed between the substrate and the TFT,
   the first barrier layer is formed into a laminated structure of a first AlOx layer and a second AlOx layer,
   a second barrier layer formed between the TFT and the organic EL layer is formed into a laminated structure of a third AlOx layer and a fourth AlOx layer, and
   a third barrier layer formed between the organic EL layer and the protective layer is formed in to a laminated structure of a fifth AlOx layer and a sixth AlOx layer.

2. The organic EL display device according to claim 1, wherein the first AlOx layer, the third AlOx layer or the fifth AlOx layer has a density larger than a density of the second AlOx layer, the fourth AlOx layer or the sixth AlOx layer, respectively.

3. The organic EL display device according to claim 1, wherein the first AlOx layer, the third AlOx layer or the fifth AlOx layer has a refractive index larger than a refractive index of the second AlOx layer, the fourth AlOx layer or the sixth AlOx layer, respectively.

4. The organic EL display device according to claim 1, wherein numbers of layers which constitute the laminated structures of the first barrier layer, the second barrier layer and the third barrier layer, are odd numbers.

5. The organic EL display device according to claim 1, wherein the substrate is formed as a polyimide substrate.

6. A liquid crystal display device having a TFT and a pixel electrode formed on a first substrate, a second substrate disposed opposite to the first substrate, and a liquid crystal interposed between the first substrate and the second substrate,
   wherein
   a first barrier layer which contains AlOx layer is formed between the TFT and the first substrate,
   the first barrier layer is formed into a laminated structure of a first AlOx layer and a second AlOx layer,
   a second barrier layer formed between the TFT and the pixel electrode is formed into a laminated structure of a third AlOx layer and a fourth AlOx layer, and
   a third barrier layer formed on the counter substrate at a side of the liquid crystal is formed in to a laminated structure of a fifth AlOx layer and a sixth AlOx layer.

7. The liquid crystal display device according to claim 6, wherein the first AlOx layer, the third AlOx layer or the fifth AlOx layer has a density larger than a density of the second AlOx layer, the fourth AlOx layer or the sixth AlOx layer, respectively.

8. The liquid crystal display device according to claim 6, wherein the first AlOx layer, the third AlOx layer or the fifth AlOx layer has a refractive index larger than a refractive index of the second AlOx layer, the fourth AlOx layer or the sixth AlOx layer, respectively.

9. The liquid crystal display device according to claim 6, wherein numbers of layers which constitute the laminated structures of the first barrier layer, the second barrier layer and the third barrier layer, are odd numbers.

10. The liquid crystal display device according to claim 6, wherein the substrate is formed as a polyimide substrate.

* * * * *